United States Patent
Hu

(10) Patent No.: US 11,282,448 B2
(45) Date of Patent: Mar. 22, 2022

(54) DISPLAY DEVICE AND DISPLAY PANEL THEREOF, OLED ARRAY SUBSTRATE

(71) Applicant: KunShan Go-Visionox Opto-Electronics Co., Ltd., Kunshan (CN)

(72) Inventor: Fengzhang Hu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 17/007,520

(22) Filed: Aug. 31, 2020

(65) Prior Publication Data

US 2020/0402452 A1 Dec. 24, 2020

Related U.S. Application Data

(63) Continuation of application No. PCT/CN2019/092702, filed on Jun. 25, 2019.

(30) Foreign Application Priority Data

Dec. 28, 2018 (CN) .......................... 201811627591.X

(51) Int. Cl.
*G09G 3/3216* (2016.01)
*G09G 3/3225* (2016.01)
(Continued)

(52) U.S. Cl.
CPC .......... *G09G 3/3216* (2013.01); *G09G 3/3208* (2013.01); *G09G 3/3225* (2013.01);
(Continued)

(58) Field of Classification Search
CPC ...... G06F 9/33; G09G 3/3208; G09G 3/3216; G09G 3/3225; G09G 3/3275;
(Continued)

(56) References Cited

U.S. PATENT DOCUMENTS

2005/0162353 A1* 7/2005 Kanda ................. H01L 27/3276
345/76
2009/0249247 A1* 10/2009 Tseng .................... G06F 3/0481
715/808

(Continued)

FOREIGN PATENT DOCUMENTS

CN 106057821 A 10/2016
CN 106653817 A 5/2017
(Continued)

OTHER PUBLICATIONS

First Office Action and Search Report dated May 8, 2020 in Chinese Application No. 201811627591.X, 18 pages (Submitted with Machine Translation).

(Continued)

*Primary Examiner* — Mihir K Rayan
(74) *Attorney, Agent, or Firm* — Maier & Maier, PLLC

(57) ABSTRACT

A display device, a display panel thereof, and an OLED array substrate. The OLED array substrate includes a display area, and the display area includes a non-transparent display area and a transparent display area. The non-transparent display area is provided with first OLED sub-pixels arranged in an array, and the transparent display area is provided with second OLED sub-pixels in one row and several columns. When the columns of second OLED sub-pixels are driven, the transparent display area performs a display function; when the columns of second OLED sub-pixels are not driven, the transparent display area performs a light transmitting function.

17 Claims, 7 Drawing Sheets

(51) Int. Cl.
  *G09G 3/3208* (2016.01)
  *H01L 27/32* (2006.01)
(52) U.S. Cl.
  CPC .............. *G09G 2300/0426* (2013.01); *G09G 2300/0452* (2013.01); *G09G 2310/0291* (2013.01); *G09G 2320/0686* (2013.01); *G09G 2330/00* (2013.01); *H01L 27/3283* (2013.01)
(58) Field of Classification Search
  CPC ... G09G 2300/0426; G09G 2300/0452; G09G 2310/0291; G09G 2320/0686; G09G 2330/00; G09G 2340/0407; H01L 27/3283
  See application file for complete search history.

(56) References Cited

U.S. PATENT DOCUMENTS

| | | | |
|---|---|---|---|
| 2018/0233550 A1 | 8/2018 | Han | |
| 2020/0052059 A1* | 2/2020 | Chen | H01L 27/3244 |
| 2020/0402443 A1* | 12/2020 | Lou | H01L 51/5209 |

FOREIGN PATENT DOCUMENTS

| | | |
|---|---|---|
| CN | 106850897 A | 6/2017 |
| CN | 107425040 A | 12/2017 |
| CN | 107610635 A | 1/2018 |
| CN | 107768545 A | 3/2018 |
| CN | 108389879 A | 8/2018 |
| CN | 108666348 A | 10/2018 |
| CN | 108766975 A | 11/2018 |
| CN | 108922900 A | 11/2018 |
| CN | 109065582 A | 12/2018 |
| JP | 2004-294891 A | 10/2004 |
| WO | 2017/126153 A1 | 7/2017 |

OTHER PUBLICATIONS

Second Office Action and Search Report dated Jul. 15, 2020 in Chinese Application No. 201811627591.X, 18 pages (Submitted with Machine Translation).
International Search Report dated Sep. 27, 2019 in International Application No. PCT/CN2019/092702, 5 pages.
Written Opinion of the International Searching Authority dated Sep. 27, 2019 in International Application No. PCT/CN2019/092702, 6 pages.

* cited by examiner

DISPLAY DEVICE AND DISPLAY PANEL THEREOF, OLED ARRAY SUBSTRATE

CROSS-REFERENCE TO RELATED APPLICATION

This application is a continuation application of International Application No. PCT/CN2019/092702 filed on Jun. 25, 2019, which claims priority to Chinese patent application No. 201811627591.X filed on Dec. 28, 2018. Both applications are incorporated herein by reference in their entireties.

TECHNICAL FIELD

The present disclosure relates to the technical field of OLED display devices, in particular to a display device and a display panel thereof, as well as an OLED array substrate.

BACKGROUND

With the rapid development of display devices, users have increasingly higher requirements on screen-to-body ratio. Since components such as a camera, a sensor, an earpiece and the like need being installed in the display screen, a part of the area in the display screen, such as a front notch region of iPhone X, is usually reserved for installing the above components.

SUMMARY

The present disclosure provides a display device suitable for a full screen, a display panel thereof, and an OLED array substrate.

The present disclosure provides an OLED array substrate including: a display area including: a non-transparent display area and a transparent display area. The non-transparent display area is provided with first OLED sub-pixels arranged in an array; and the transparent display area is provided with one row and several columns of second OLED sub-pixels. When the columns of second OLED sub-pixels are driven, the transparent display area performs a display function; when the columns of second OLED sub-pixels are not driven, the transparent display area performs a light transmitting function.

A driving mode for the first OLED sub-pixels is active; the first OLED sub-pixels are driven by a part of data signal channels of a display driver integrated chip; a driving mode for the second OLED sub-pixels is passive; the second OLED sub-pixels are driven by a remaining part of the data signal channels of the display driver integrated chip; data from the data signal channels correspond to one frame of screen display in the display area.

In a direction perpendicular to a plane where the OLED array substrate is located, each of the first OLED sub-pixels comprises: a lower electrode, a first OLED light emitting structure disposed over the lower electrode, and an upper electrode disposed over the first OLED light emitting structure; and in a direction perpendicular to the plane where the OLED array substrate is located, each of the second OLED sub-pixels comprises: a first electrode extending along a column direction, a second OLED light emitting structure disposed over the first electrode and extending along the column direction, and a second electrode disposed over the second OLED light emitting structure.

Optionally, the lower electrode is a block electrode; the first electrode is a strip electrode.

Optionally, all the columns of the second OLED sub-pixels in the transparent display area are sub-pixels of a same color, or all columns of the second OLED sub-pixels in a section of the transparent display area are sub-pixels of the same color; first electrodes in the columns of the second OLED sub-pixels of the same color correspond to a same data signal channel or different data signal channels of the display driver integrated chip.

Optionally, an operational amplifier circuit is provided between the first electrode in each column of the second OLED sub-pixels of the same color and a corresponding data signal channel of the display driver integrated chip, the operational amplifier circuit is configured to amplify a data signal of the display driver integrated chip and input the amplified data signal to the first electrode in a corresponding column of the second OLED sub-pixels of the same color.

Optionally, each of the data signal channels of the display driver integrated chip is connected to an open drain circuit, an output of the open drain circuit is connected to the first electrodes of the second OLED sub-pixels, and a source electrode of the open drain circuit is connected to a power supply voltage.

Optionally, the second OLED sub-pixels comprise sub-pixels of different colors, and a plurality of adjacent columns of the second OLED sub-pixels of different colors form one pixel unit; the first electrodes in the columns of the second OLED sub-pixels of a same color correspond to a same data signal channel or different data signal channels of the display driver integrated chip.

Optionally, an operational amplifier circuit is provided between the first electrodes in the columns of the second OLED sub-pixels of a same color and a corresponding data signal channel of the display driver integrated chip, the operational amplifier circuit is configured to amplify a data signal of the display driver integrated chip and input the amplified data signal to the first electrodes of the corresponding second OLED sub-pixels of the same color Optionally, each of the data signal channels of the display driver integrated chip is connected to an open drain circuit, an output of the open drain circuit is connected to the first electrodes of the second OLED sub-pixels, and a source electrode of the open drain circuit is connected to a power supply voltage.

Optionally, the second electrodes of the second OLED sub-pixels form a planar electrode, and/or the upper electrodes and the first OLED sub-pixels and the second electrodes of the second OLED sub-pixels are connected as a planar electrode.

Optionally, a projection of the first electrode in each column of the second OLED sub-pixels on the plane where the OLED array substrate is located is composed of one or more graphic units; shapes of the graphic units comprising a circle, an ellipse, a dumbbell, an "8" shape, or a rectangle.

Optionally, the first electrodes and the second OLED light emitting structures of the second OLED sub-pixels extending along a column direction in a middle section of the transparent display area, or extending from a top of the transparent display area to a middle or bottom of the transparent display area along the column direction, or extending from the middle of the transparent display area to the bottom of the transparent display area along the column direction.

Optionally, adjacent ones of the second OLED sub-pixels form a pattern, and the pattern comprises a battery-shaped pattern and/or a pattern representing a signal strength.

Optionally, a plurality of the second OLED light emitting structures are separated by pixel definition layers.

Optionally, a ratio of a length of the first electrode in a column direction to a width in a row direction is larger than 20:1.

The present disclosure provides a display panel including the OLED array substrate according to any one of the above.

The present disclosure provides a display device including the display panel described above.

Figure 1:
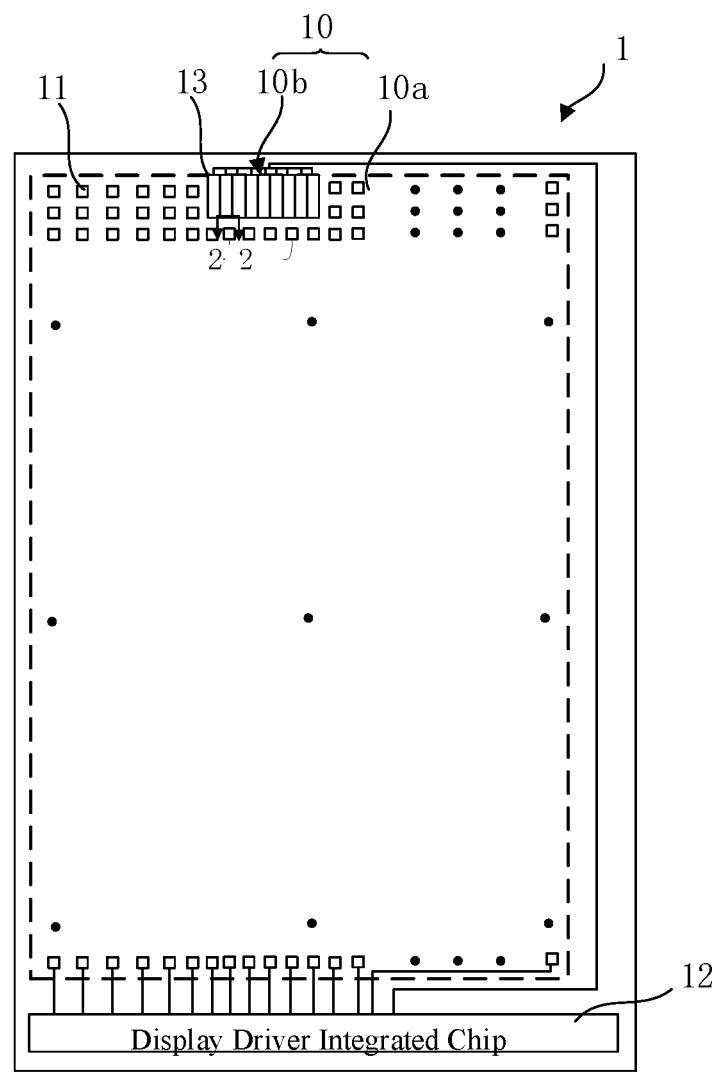
FIG. 1 is a top view of an OLED array substrate in an example of the present disclosure.

In order to facilitate understanding of the present disclosure, all reference numerals in the present disclosure are listed below:

| | |
|---|---|
| OLED array substrate 1, 2, 3, 4 | Display area 10 |
| Non-transparent display area 10a | Transparent display area 10b |
| First OLED sub-pixel 11 | Display driver integrated chip 12 |
| Second OLED sub-pixel 13, 13', 13" | First electrode 131 |
| Second electrode 132 | Second OLED light emitting structure 133 |
| Pixel definition layer 14 | NMOS transistor T1 |
| PMOS transistor T2 | Storage capacitor C |
| Pull-up resistor R | High level $V_{GH}$ |
| First resistor R1 | Second resistor R2 |

DETAILED DESCRIPTION OF THE EMBODIMENTS

In the present disclosure:

Generally, the reason why display of a transparent display area and a non-transparent display area are not synchronized is that the transparent display area and the non-transparent display area respectively use their own display drivers to provide switching signals and/or data signals, which are not related to each other.

In the present disclosure, a driving mode for the second OLED sub-pixels in the transparent display area is set to be passive, and a driving mode for the first OLED sub-pixels in the non-transparent display area is set to be active; and a same display driver integrated chip is used to drive the second OLED sub-pixels in the transparent display area and the first OLED sub-pixels in the non-transparent display area on a same OLED array substrate, that is, a part of the data signal channels in the display driver integrated chip are provided to the columns of the first OLED sub-pixels; and the remaining data signal channels are provided to the columns of the second OLED sub-pixels. Data in all the data signal channels of the display driver integrated chip correspond to one frame of screen display in the display area. Thus, by associating the data signal channels in the display driver integrated chip, consistency of the picture and synchronization of the driving can be achieved.

In addition, the second OLED sub-pixels in the transparent display area are arranged in one row and several columns, which can reduce the boundary of the graphic film layers and mitigate diffraction problems during light transmission, so that the imaging performance of light sensors in the transparent display area can be improved.

In an alternative example, a second OLED light emitting structure extends in a column direction over a first electrode, that is, one first electrode has one second OLED light emitting structure thereon. In another alternative example, a plurality of second OLED light emitting structures are distributed spaced apart over the first electrode. The example can improve the pixel density in the transparent display area.

In an alternative example, a) all second OLED pixels in the transparent display area are second OLED sub-pixels of a same color, or all columns of second OLED sub-pixels in a certain area of the transparent display area are second OLED sub-pixels of a same color; or b) columns of second OLED pixels in the transparent display area are sub-pixels of different colors, or columns of second OLED pixels in a certain area of the transparent display area are sub-pixels of different colors. For the example of a), when the transparent display area performs a display function, the area emits monochromatic light, such as a red light, a blue light, or a green light. For the example of b), compared with the non-transparent display area, the transparent area may include a plurality of pixel units including multiple sub-pixels of different colors arranged in one row and several columns. In this way, when the transparent display area performs the display function, the sub-pixels in the pixel units emit lights of different colors, which can achieve a multi-color display.

In an alternative example, for example a), the first electrodes in the columns of the second OLED sub-pixels of the same color correspond to a same data signal channel or different data signal channels of the display driver integrated chip. Compared with the latter configuration, the former one requires less data signal channels, fewer traces, and smaller occupied area.

In an alternative example, an operational amplifier circuit is provided between the first electrode in each column of the second OLED sub-pixels of the same color and a corresponding data signal channel of the display drive integrated chip. The operational amplifier circuit is configured to amplify a data signal of the display driver integrated chip and input the amplified data signal to the first electrode in a corresponding column of the second OLED sub-pixels of the same color.

In another alternative example, a data signal channel of the display driver integrated chip is connected to an open drain circuit, the open drain circuit is connected to a gate electrode of a switching transistor, and a drain electrode of the switching transistor is connected to the first electrodes in the columns of the second OLED sub-pixels of the same color, and a source electrode is connected to a power voltage.

Both of the above alternative examples can provide a sufficiently large driving current for the light emission of the second OLED sub-pixels of the same color.

For example b), the first electrodes in the columns of the second OLED sub-pixels of the same color in the pixel units correspond to a same data signal channel or different data signal channels of the display driver integrated chip. Compared with the latter configuration, the former one requires less data signal channels, fewer traces, and less occupied area.

In an alternative example, an operational amplifier circuit is provided between each column of the second OLED sub-pixels of the same color or the first electrode in each column of the second OLED sub-pixels of the same color and a corresponding data signal channel of the display driver integrated chip. The operational amplifier circuit is configured to amplify a data signal of the display driver integrated chip and input the amplified data signal to the first electrode in the corresponding column of the second OLED sub-pixels of the same color.

In another alternative example, a data signal channel of the display driver integrated chip is connected to an open drain circuit, a drain electrode of the open drain circuit is connected to a gate electrode of the switching transistor, and a drain electrode of the switching transistor is connected to corresponding columns of the second OLED sub-pixels of a same color or the first electrodes in the corresponding columns of the second OLED sub-pixels of the same color, and a source electrode of the open drain circuit is connected to power voltage.

Both of the above alternative examples can provide a sufficiently large driving current for the light emission of the columns of second OLED sub-pixels.

In an alternative example, in the columns of second OLED sub-pixels, the first electrodes in one or more of the columns of second OLED sub-pixels extend from a top to a middle or bottom of the transparent display area in the column direction, or extend from the middle of the transparent display area along the column direction to the bottom of the transparent display area, or extend along the column direction in a middle section of the transparent display area. Further, the second OLED pixels in adjacent columns can form a pattern including: a battery-shaped pattern and/or a pattern representing a signal strength.

In an alternative example, a projection of the first electrode in each column of the second OLED sub-pixels of the transparent display area on the plane where the OLED array substrate is located is composed of one or more graphic units. The shapes of the graphic unit include circle, ellipse, dumbbell-shaped, "8"-shaped or rectangular. These shapes allows diffraction fringes to cancel each other out, helping to reduce diffraction in the light transmission mode of the transparent display area and improve the imaging quality.

In an alternative example, each column of second OLED pixels in the transparent display area includes a first electrode and a second OLED light emitting structure arranged from bottom to top, and the second electrodes of columns of OLED pixels are interconnected. Same as the second OLED light emitting structures, the first electrodes are also arranged in one row and several columns. One row of light emitting structure corresponds to one row of first electrode, which can shorten the boundary of the pattern film layer and mitigate the diffraction problem.

In order to make the above objects, features and advantages of the present disclosure more apparent and understandable, specific examples of the present disclosure will be described in detail below with reference to the drawings.

As a part of the area above the display screen is usually reserved for the installation of one or more cameras, one or more sensors, one or more earpieces and other components, the overall consistency of the screen is easy to be affected.

Figure 2:
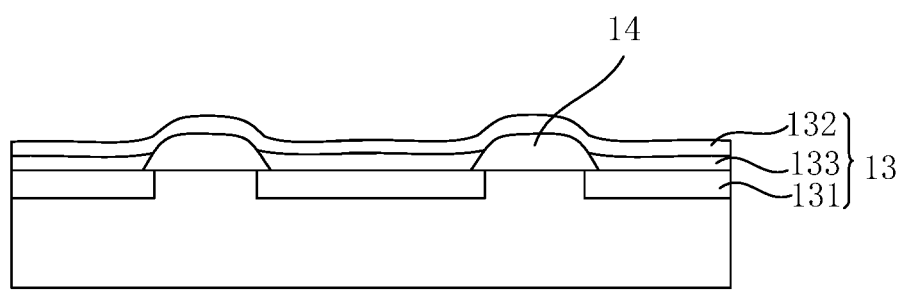
FIG. 2 is a cross-sectional view taken along a line 2-2 in FIG. 1.

FIG. 1 is a top view of an OLED array substrate in an example of the present disclosure; and FIG. 2 is a cross-sectional view taken along line 2-2 in FIG. 1.

Referring to FIGS. 1 and 2, the OLED array substrate 1 includes a display area 10, and the display area 10 includes a non-transparent display area 10a and a transparent display area 10b.

The non-transparent display area 10a includes first OLED sub-pixels 11 arranged in an array. In a direction perpendicular to a plane where the OLED array substrate 1 is located, a first OLED sub-pixel 11 includes: a lower electrode, a first OLED light emitting structure disposed over the lower electrode and extending along a column direction of the first OLED sub-pixels 11, and an upper electrode disposed over the first OLED light emitting structure. The lower electrode of the first OLED sub-pixel 11 is disposed proximate to the OLED array substrate 1. A driving mode for the first OLED sub-pixels 11 is active, and the first OLED sub-pixels 11 are driven by a part of the data signal channels of a display driver integrated chip 12. In an example, the lower electrode can be a block electrode.

The transparent display area 10b includes second OLED sub-pixels 13 in one row and several columns. In a direction perpendicular to the plane where the OLED array substrate 1 is located, each column of the second OLED sub-pixels 13 includes: a first electrode extending along the column direction of the second OLED sub-pixels 13, a second OLED light emitting structure disposed over the first electrode and extending along the column direction and a second electrode 132 disposed over the second OLED light emitting structure. In an example, the first electrode can be a strip electrode.

When the columns of second OLED sub-pixels 13 are driven, the transparent display area 10b performs a display function; and when the columns of second OLED sub-pixels 13 are not driven, the transparent display area 10b performs a light transmitting function. A driving mode for the columns of second OLED sub-pixels 13 is passive, and the columns of second OLED sub-pixels 13 are driven by remaining data signal channels of the display driver integrated chip 12. The data of all the data signal channels correspond to one frame of screen display in the display area 10.

Referring to FIG. 2, in a direction perpendicular to the plane where the OLED array substrate 1 is located, the second OLED sub-pixel 13 includes: a first electrode 131 extending in a column direction, a second OLED light emitting structure 133, and a second electrode 132. The second OLED light emitting structures 133 are separated by pixel definition layers 14. The structure of the first OLED sub-pixel 11 is the same as the structure of the second OLED sub-pixel 13. In other alternative examples, there can be no pixel definition layer 14 between the second OLED light emitting structures 133.

The difference between the second OLED sub-pixel 13 and the first OLED sub-pixel 11 is that for the first OLED sub-pixels 11, the lower electrodes, the first OLED light emitting structures and the upper electrodes are arranged in an array of several rows and several columns and spaced apart in the non-transparent display area 10a. For the columns of the second OLED sub-pixels 13, the first electrodes 131 and the second OLED light emitting structures 133 extend from the top of the transparent display area 10b to the bottom along the column direction. For the columns of the second OLED sub-pixels 13, the second electrodes 132 may extend from the top of the transparent display area 10b to the bottom along the column direction or the second electrodes 132 in the columns of the second OLED sub-pixels 13 are interconnected to form a planar electrode as shown in FIG. 2. In an embodiment, the upper electrodes of the first OLED sub-pixels and the second electrodes of the second OLED sub-pixels are interconnected to form a planar electrode.

In FIG. 1, the transparent display area 10b is located at the top middle of the non-transparent display area 10a. In other alternative examples, the transparent display area 10b can also be located at any position in the non-transparent display area 10a. For example, the transparent display area 10b can be located at the top left or top right of the non-transparent display area 10a, or at the bottom left, bottom right, or bottom middle of the non-transparent display area 10a, or at the middle of the non-transparent display area 10a.

In FIGS. 1 and 2, all the second OLED sub-pixels 13 in the transparent display area 10b are sub-pixels of the same color. In an alternative example, all the second OLED sub-pixels 13 in the transparent display area 10b can be one of red sub-pixels, green sub-pixels, blue sub-pixels, or yellow sub-pixels. In other words, when the transparent display area 10b performs the display function, the area emits monochrome light.

In other alternative examples, the arrangement of the first electrodes 131 and the second OLED light emitting structures 133 in the second OLED sub-pixels 13 can also be set to be completely the same as that of the first OLED sub-pixels 11. The first electrodes 131 and the second OLED light emitting structures 133 of the second OLED sub-pixels 13 in the transparent display area 10b are arranged in several columns extending in the column direction. Specifically, in an example, the first electrodes 131 and the second OLED light emitting structures 133 extend from the top to the bottom of the transparent display area 10b. Compared with the arrangement of several rows and columns in an array, such an arrangement can shorten the boundary of the graphic film layers and mitigate the diffraction problem during light transmission.

In an alternative example, a projection of the first electrode of each column of second OLED sub-pixel 13 on the plane where the OLED array substrate is located can be composed of one or more graphic units. The shape of the graphic unit is one of a circle, an ellipse, a dumbbell, an "8"-shape, or a rectangle. Providing the graphic unit in the above shapes can further reduce diffraction.

In an alternative example, a ratio of the length in the column direction to a width in the row direction of the first electrode 131 extending in the column direction is larger than 20:1. In a specific implementation, the ratio can also be larger than 40:1, 100:1, 200:1 or 800:1.

The light emission driving mode for the columns of second OLED sub-pixels 13 in the transparent display area 10b will be described below.

In a Passive Matrix OLED (PMOLED), also known as passively driven OLED, the second electrodes and the first electrodes are simply arranged into a array, and pixels at intersecting points of rows and columns in the array are lighted up in a scanning manner. Each pixel is operated in a short pulse mode and emits instantaneously light of high brightness. In other words, the addressing of each second OLED sub-pixel 13 is directly controlled by an external circuit. The external circuit may be controlled by a Display Driver Integrated Circuit (DDIC).

Figure 3:
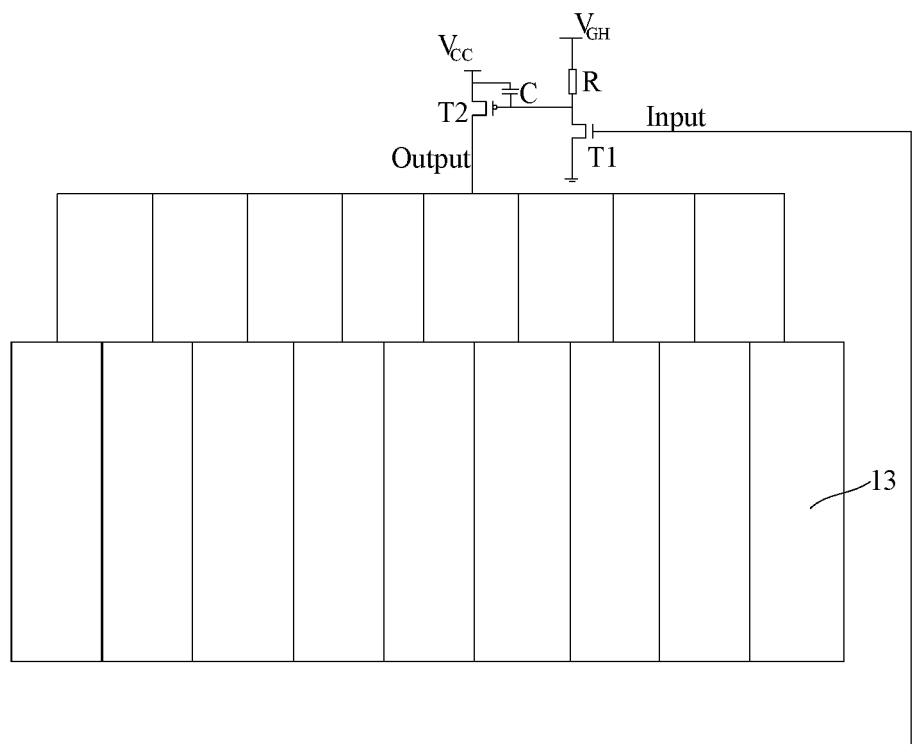
FIG. 3 is a schematic diagram of a first type of a passive driving circuit for the columns of second OLED sub-pixels in the transparent display area.

FIG. 3 is a schematic diagram of a passive driving circuit for the columns of second OLED sub-pixels in the transparent display area. Referring to FIG. 3, the first electrodes in the columns of the second OLED sub-pixels 13 are collectively connected to an output of an open drain circuit. An input of the open drain circuit is connected to one data signal channel of the display driver integrated chip 12. The second electrodes in the columns of the second OLED sub-pixels 13 are grounded.

The open drain circuit includes an N-Metal-Oxide-Semiconductor (NMOS) transistor T1, a P-Metal-Oxide-Semiconductor (PMOS) transistor T2, a storage capacitor C, and a pull-up resistor R. The operation process is as follows.

During a first time period, when a data signal of a data signal channel is low level "0", the NMOS transistor T1 is cut off, a high level $V_{GH}$ is applied to a gate electrode of the PMOS transistor T2 via the pull-up resistor R, and the PMOS transistor T2 is cut off. The columns of second OLED sub-pixels 13 are not driven.

During a second time period, when the data signal of the data signal channel is high level "1", the NMOS transistor T1 is turned on, and a drain electrode of the NMOS transistor T1 is grounded. The PMOS transistor T2 is also turned on, and the source power supply voltage VCC is controlled to supply the first electrodes in the columns of the second OLED sub-pixels 13 in the transparent display area 10b. During a next time period, the data signal of the data signal channel changes to a low level "0", at this time, the NMOS transistor T1 is turned off. Since the pull-up resistor R has a large resistance value, it takes some time to charge the capacitor C, so the gate voltage of the PMOS transistor T2 increases slowly, the PMOS transistor T2 is turned on for a short period of time, and the second OLED sub-pixels 13 emit light transiently until the PMOS transistor T2 is completely cut off.

During the operation process of the above open drain circuit, the ratio of the first time period to the second time period, the capacitance of the storage capacitor C and the resistance of the pull-up resistor R can be adjusted, so that the second OLED sub-pixels 13 are perceived to be emitting light continuously with visual lag.

The color data carried in the data signal is consistent with the color of the columns of second OLED sub-pixels 13. In other words, since the transparent display area 10b has only one row of second OLED sub-pixels 13, and in this example, the columns of second OLED sub-pixels 13 are all sub-pixels of a same color, only a same driving current is to be applied to the columns of second OLED sub-pixels 13, where the driving current occupies one data signal channel (data line, source line) of the display driver integrated chip (DDIC). The remaining data signal channels of the display driver integrated chip can be provided to the columns of first OLED sub-pixels 11 in the non-transparent display area 10a, where each column of the first OLED sub-pixels 11 occupies one data signal channel. The data of all data signal channels of the display driver integrated chip corresponds to one frame of screen display in the display area 10. In other words, in an image refresh cycle, the data of the data signal channels comes from processing one image.

In other alternative examples, the open drain circuit can also adopt other circuit structures, which is not limited in the present disclosure.

Figure 4:
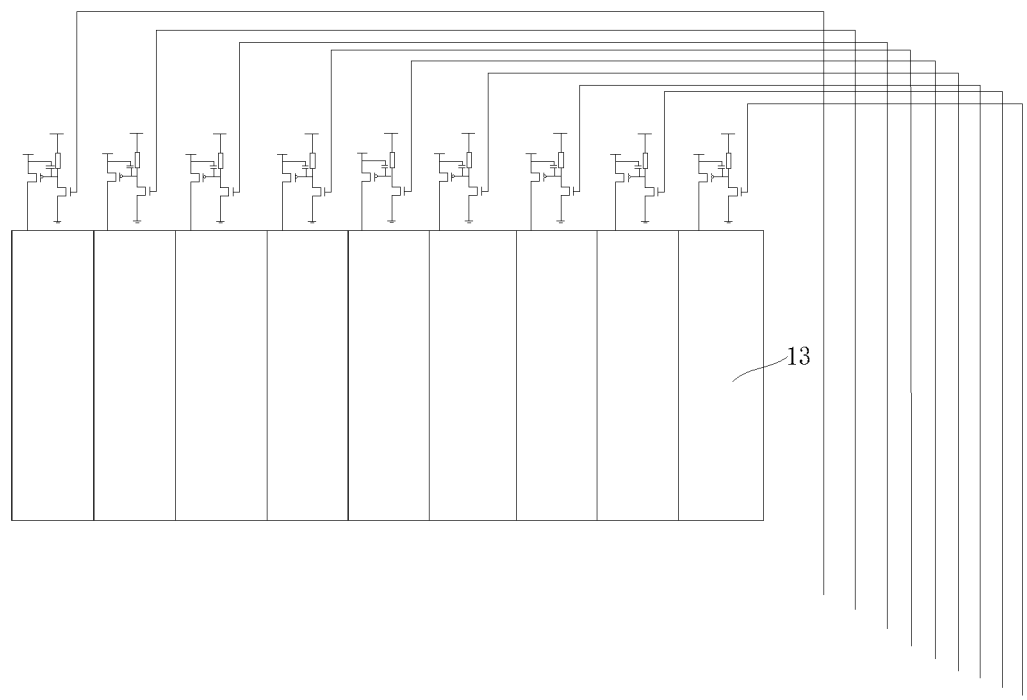
FIG. 4 is a schematic diagram of a second type of the passive driving circuit for the columns of second OLED sub-pixels in the transparent display area.

FIG. 4 is a schematic diagram of another passive driving circuit for the columns of second OLED sub-pixels in the transparent display area. Referring to FIG. 4, the first electrode of the second OLED sub-pixel 13 in each column is connected to an output of one open drain circuit. An input of the open drain circuit is connected to one data signal channel of the display driver integrated chip 12. The second electrodes of the second OLED sub-pixels 13 are grounded.

The structure and connection method of each open drain circuit are the same as those of FIG. 3. The color data carried in each data signal is consistent with the color of the connected second OLED sub-pixel 13. In other words, since the transparent display area 10b has only one row of second OLED sub-pixels 13, driving currents are only to be applied to the columns of second OLED sub-pixels 13, where the driving currents for the columns of second OLED sub-pixels 13 occupy several data signal channels (source lines) of the display driver integrated chip (DDIC), and each column of second OLED sub-pixel 13 occupies one data signal channel. The remaining data signal channels of the display driver integrated chip can be provided to the columns of first OLED sub-pixels 11 in the non-transparent display area 10a, where each column of the first OLED sub-pixels 11 occupies one data signal channel. The data of all data signal channels of the display driver integrated chip corresponds to one frame of screen display in the display area 10.

In the examples of FIG. 3 and FIG. 4, the wiring of the first electrodes in the columns of the second OLED sub-pixels 13 is arranged in a edge area of the OLED array substrate 1, where the edge area is located in a peripheral area of the display area 10. In other alternative examples, the wiring of the first electrodes in the columns of the second OLED sub-pixels 13 can also be arranged in the non-transparent display area 10a or the transparent display area 10b. Compared with the example in which the wiring is arranged in the transparent display area 10b, the example in which the wiring is arranged in the edge area and the non-transparent display area 10a can further reduce the number of graphic film layers in the transparent display area 10b and further mitigate the diffraction problem under the light transmission mode.

Compared with the example shown in FIG. 4, the number of data signal channels can be less in the example shown in FIG. 3, the number of wires connecting the data signal channels and the sub-pixels can also be less, and the occupied area can be smaller.

Figure 5:
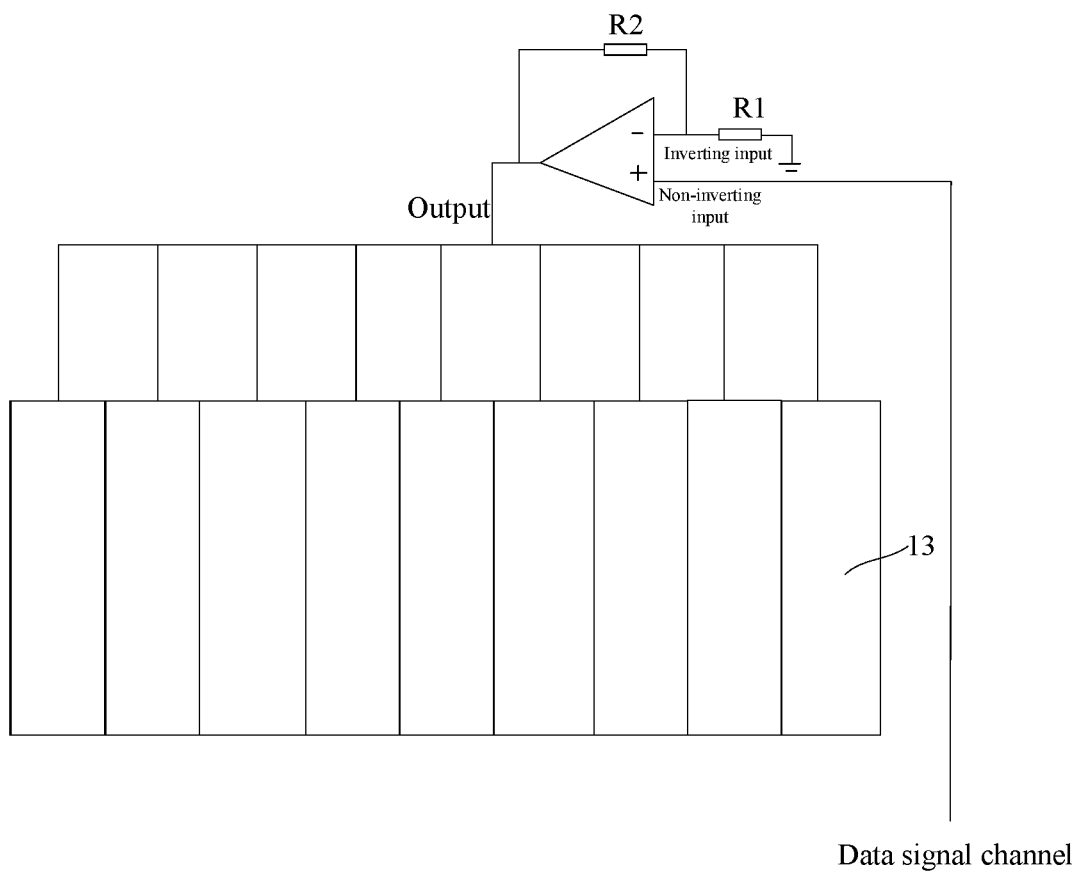
FIG. 5 is a schematic diagram of a third type of the passive driving circuit for the columns of second OLED sub-pixels in the transparent display area.

FIG. 5 is a schematic diagram of another passive driving circuit for the columns of second OLED sub-pixels 13 in the transparent display area. Referring to FIG. 5, the first electrodes in the columns of the second OLED sub-pixels 13 are collectively connected to an output of an operational amplifier circuit, and a non-inverting input of the operational amplifier circuit is connected to one data signal channel of the display drive integrated chip. An inverting input of the operational amplifier circuit is connected to the first resistor R1, and a second resistor R2 is connected between the inverting input and the output. The corresponding magnification of this circuit is: (R2+R1)/R1. In this example, the driving currents applied to the first electrodes in the columns of the second OLED sub-pixels 13 can be adjusted by the magnitude of the data signal. In this example, the columns of second OLED sub-pixels 13 occupy one data signal channel (source line) of the display driver integrated chip (DDIC). The remaining data signal channels of the display driver integrated chip can be provided to the columns of first OLED sub-pixels 11 in the non-transparent display area 10a, where each column of the first OLED sub-pixels 11 occupies one data signal channel. The data of all data signal channels of the display driver integrated chip corresponds to one frame of screen display in the display area 10.

In other alternative examples, also referring to the example shown in FIG. 4, the first electrode of the second OLED sub-pixel 13 in each column is connected to an output of one operational amplifier circuit, and a non-inverting input of each operational amplifier circuit is connected to one data signal channel of the display driver integrated chip. Whether the second OLED sub-pixel 13 of each column performs display function and the display brightness of the second OLED sub-pixel 13 can be controlled independently. In this example, the columns of second OLED sub-pixels occupy several data signal channels (source lines) of the display driver integrated chip (DDIC), and each column of second OLED sub-pixel 13 occupies one data signal channel. The remaining data signal channels of the display driver integrated chip can be provided to the columns of first OLED sub-pixels 11 in the non-transparent display area 10a. The data of all data signal channels of the display driver integrated chip corresponds to one frame of screen display in the display area 10.

In other alternative examples, the operational amplifier circuit can also adopt other circuit structures, which is not limited in the present disclosure.

Figure 6:
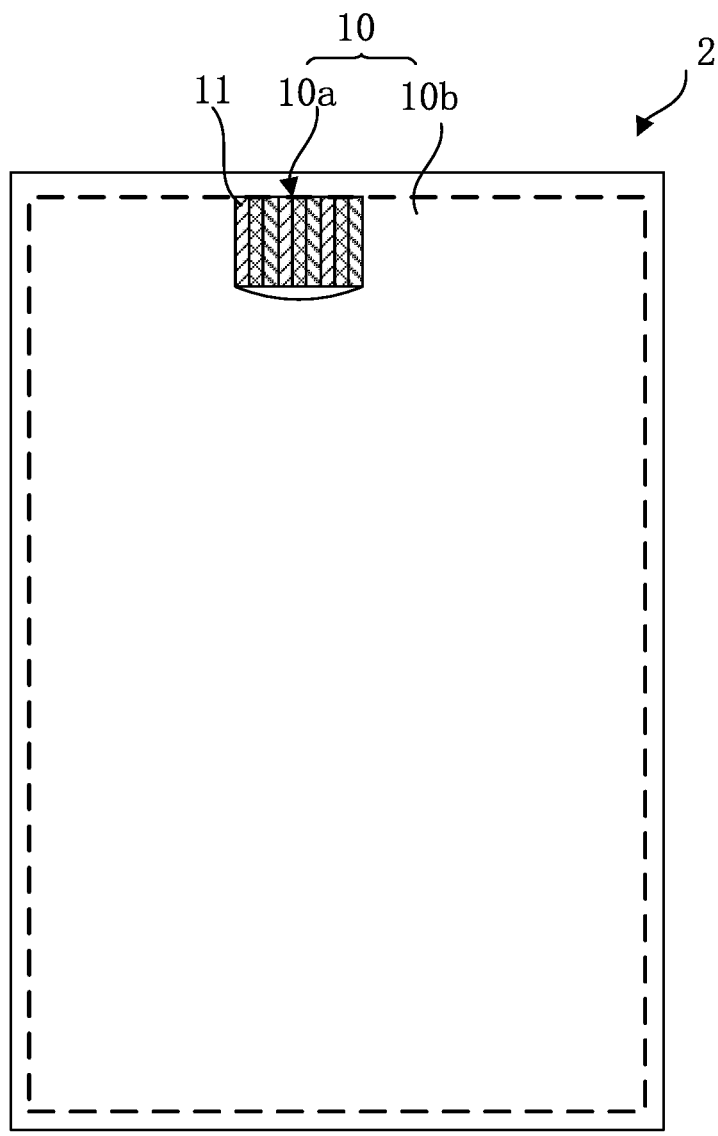
FIG. 6 is a top view of an OLED array substrate in another example of the present disclosure.

FIG. 6 is a top view of an OLED array substrate in another example of the present disclosure. The OLED array substrate 2 shown in FIG. 6 is substantially the same as the OLED array substrate 1 shown in FIG. 1, and the only difference is that the columns of second OLED sub-pixels 13 in the transparent display area 10b or the columns of second OLED sub-pixels 13 in a certain area of the transparent display area 10b are sub-pixels of different colors. Several adjacent sub-pixels of different colors form one pixel unit. In other words, in one pixel unit, a column of red sub-pixel, a column of green sub-pixel, and a column of blue sub-pixel are alternately arranged. In other alternative examples, each column of sub-pixel in the pixel unit can be other colors than red, green, and blue.

For the specific structure of the second OLED sub-pixels 13, reference may be made to the specific structure in the above example. The following will focus on difference between a driving mode for the second OLED sub-pixels of different colors and a driving mode for the second OLED sub-pixels of a same color.

Figure 7:
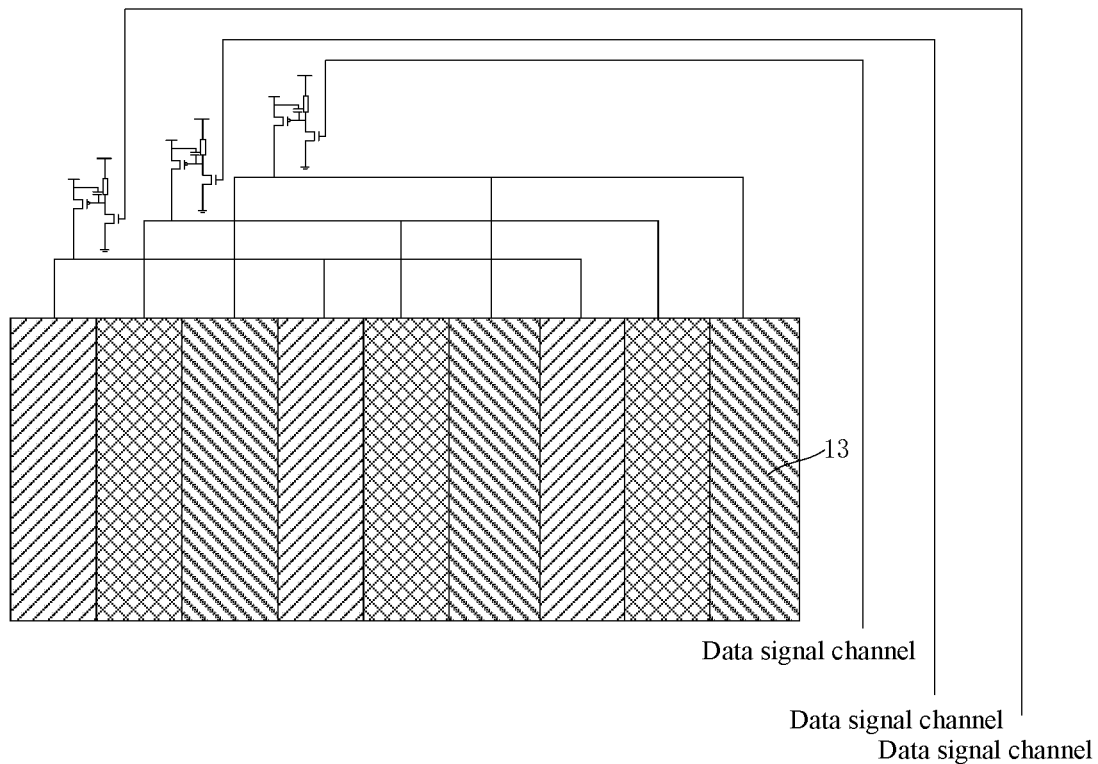
FIG. 7 is a schematic diagram of a first type of a passive driving circuit for the columns of second OLED sub-pixels in the transparent display area.

FIG. 7 is a schematic diagram of a passive driving circuit for the columns of second OLED sub-pixels in the transparent display area. Referring to FIG. 7, three adjacent second OLED sub-pixels of different colors form a second OLED pixel unit. The first electrodes of the columns of second OLED sub-pixels 13 of a same color in respective second OLED pixel units may be collectively connected to an output of one open drain circuit. An input of the open drain circuit is connected to one data signal channel of the display driver integrated chip 12. For the structure and working process of the open drain circuit, reference can be made to the structure and operation process of the open drain circuit in the example of FIG. 3. In other words, the first electrodes of all red sub-pixels are connected to a same R data signal channel through an open drain circuit; the first electrodes of all green sub-pixels are connected to a same G data signal channel through an open drain circuit; the first electrodes of all blue sub-pixels are connected to a same B data signal channel through an open drain circuit. Since the transparent display area 10b has only one row and three columns of second OLED pixel units, only a same driving current is to be applied to the columns of the second OLED sub-pixels 13 of the same color. The driving currents come from three data signal channels (source lines) of the display driver integrated chip (DDIC). The remaining data channels of the display driver integrated chip can be provided to the columns of the first OLED sub-pixels 11 of the non-transparent display area 10a, and each column of the first OLED sub-pixels 11 occupies one data signal channel. The data of all data signal channels of the display driver integrated chip corresponds to one frame of screen in the display area 10.

In other alternative examples, the first electrodes of the second OLED sub-pixels 13 that of a same color in respective second OLED pixel units can also be separately connected to an output of one open drain circuit. An input of each open drain circuit is connected to a data signal channel of the display driver integrated chip 12. In other words, the first electrodes in the columns of the red sub-pixels are connected to a R data signal channel through a respective open drain circuit; the first electrodes in the columns of the green sub-pixels are connected to a G data signal channel through a respective open drain circuit; and the first electrodes in the columns of the blue sub-pixels are connected to a B data signal channel through a respective open drain circuit. The columns of the second OLED sub-pixels occupy several data signal channels (source lines) of the display driver integrated chip (DDIC), where each column of the second column OLED sub-pixels 13 occupies one data signal channel of the display driver integrated chip.

Figure 8:
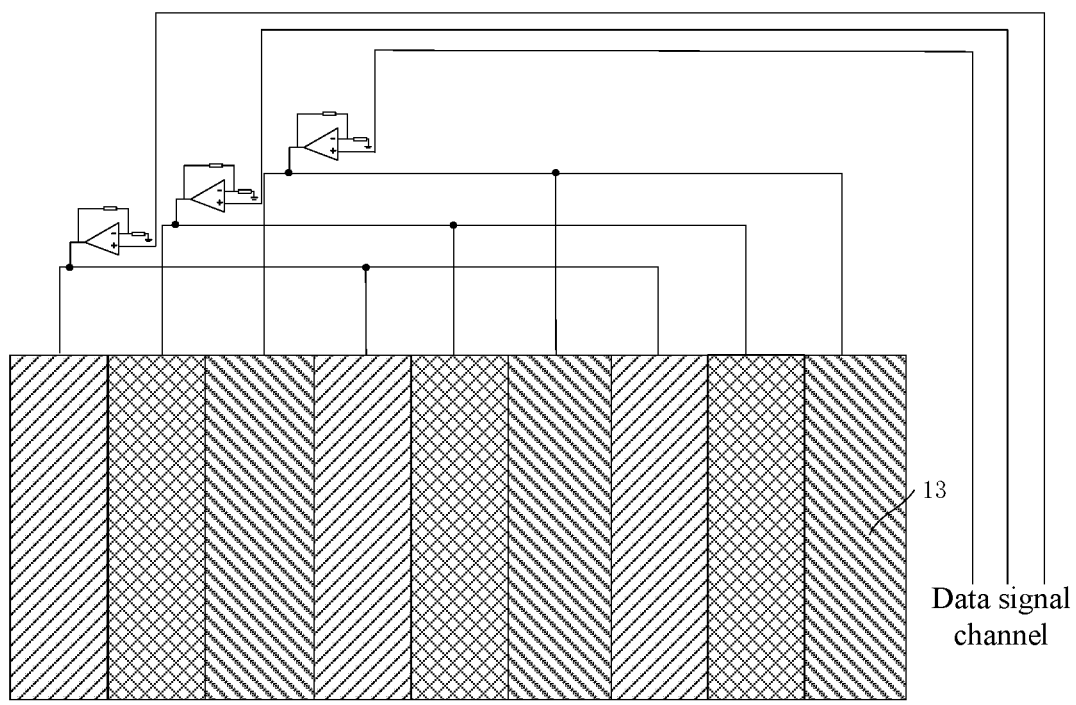
FIG. 8 is a schematic diagram of a second type of the passive driving circuit for the columns of second OLED sub-pixels in the transparent display area.

FIG. 8 is a schematic diagram of another passive driving circuit for the columns of second OLED sub-pixels in the transparent display area. Referring to FIG. 8, three adjacent second OLED sub-pixels of different colors form one second OLED pixel unit. The first electrodes of columns of the second OLED sub-pixels 13 of a same color in respective second OLED pixel units are collectively connected to an output of a same operational amplifier circuit. An input of the operational amplifier circuit is connected to one data signal channel of the display driver integrated chip. In this case of the embodiment, the number of data signal channels and wires can be less, and the occupied area can be smaller. In other alternative examples, each of the first electrodes of the second OLED sub-pixels 13 that of a same-color in respective second OLED pixel units is separately connected to an output of one operational amplifier circuit, and an input of each operational amplifier circuit is connected to one data signal channel of the display driver integrated chip.

Figure 9:
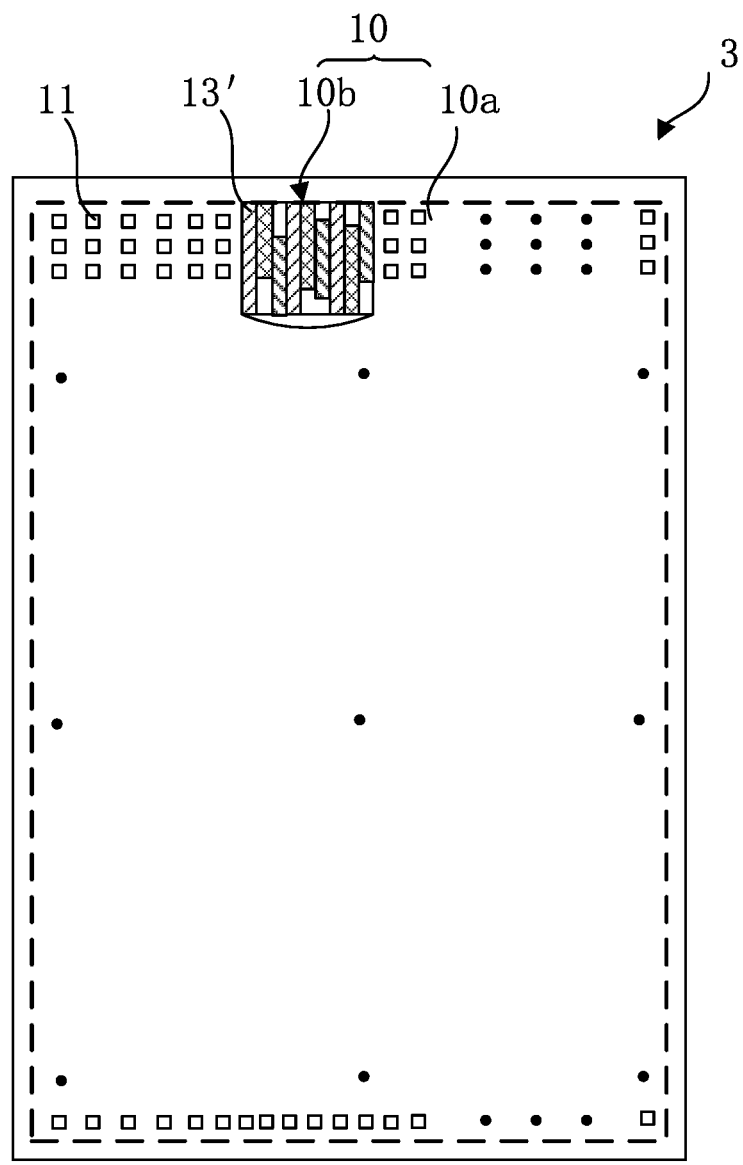
FIG. 9 is a top view of an OLED array substrate in still another example of the present disclosure.

FIG. 9 is a top view of an OLED array substrate in still another example of the present disclosure. Referring to FIG. 9, the OLED array substrate 3 in this example is substantially the same as the OLED array substrates 1 and 2 in the above examples, the only difference is that a column of second OLED sub-pixel 13' may extend in a column direction in a middle section of the transparent display area 10b, or extend in the column direction from a top of the transparent display area 10b to a middle of the transparent display area 10b, or extend in the column direction from the middle of the transparent display area 10b to the bottom of the transparent display area 10b. Several adjacent columns of second OLED sub-pixels form a pattern, and the pattern includes: a battery-shaped pattern and/or a pattern representing signal strength. Unlike the previous examples in which different intensities of driving currents are applied to the first electrodes, and/or driving currents are applied to sub-pixels of different colors to display different patterns, in this example, the columns of second OLED sub-pixels 13' of various structures can also be combined with each other to display various patterns.

The columns of second OLED sub-pixels 13' in the above-mentioned arrangement may be sub-pixels of a same color, that is, the transparent display area 10b performs a monochrome display function. The columns of second OLED sub-pixels 13' may also be second OLED sub-pixels 13' of different colors, that is, the transparent display area 10b performs a multi-color display function.

Figure 10:
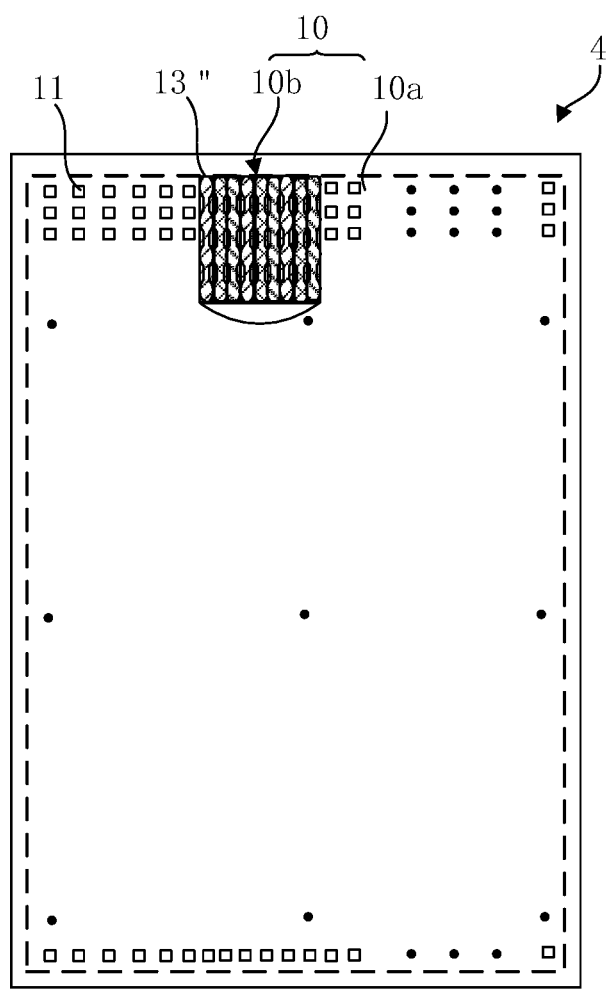
FIG. 10 is a top view of an OLED array substrate in yet another example of the present disclosure.

FIG. 10 is a top view of an OLED array substrate in yet another example of the present disclosure. Referring to FIG. 10, the OLED array substrate 4 in this example is substantially the same as the OLED array substrates 1, 2, and 3 in the above examples, and the only difference is that one, some, or all of the columns of second OLED sub-pixels 13" have an "8" shape in a column direction. In other words, the first electrodes and the second OLED light-emitting structures of the second OLED sub-pixels 13" in one, some, or all of the columns have an "8" shape in the column direction. Relative to the second OLED sub-pixels having a rectangular shape with right-angle corners or a rectangular shape with rounded corners, the above structure can further reduce the diffraction phenomenon during light transmission.

The columns of second OLED sub-pixels 13" may be sub-pixels of a same color, that is, the transparent display area 10b performs a monochrome display function. The columns of second OLED sub-pixels 13" may also be second OLED sub-pixels 13" of different colors, that is, the transparent display area 10b performs a multi-color display function.

In addition to being used as a display component, the above-mentioned OLED array substrate may also be provided with a touch layer therein to be used as a touch panel. The above OLED array substrate may also, as a semi-finished product, be integrated or assembled with other components to form a display device such as a mobile phone, a tablet computer, or a car display screen.

In the display device, a light sensor may be provided under the transparent display area 10b of the OLED array substrate. The light sensor includes: one or more of a camera, an iris recognition sensor, and a fingerprint recognition sensor.

Although the present disclosure is disclosed as above, the present disclosure is not limited to the above disclosure. Any person skilled in the art can make various changes and modifications without departing from the spirit and scope of the present disclosure. Therefore, the protection scope of the present disclosure shall be subject to the scope defined by the claims.

The invention claimed is:

1. An OLED array substrate, comprising:
a display area,
a non-transparent display area in which first OLED sub-pixels are arranged in an array;
a transparent display area in which one row and several columns of second OLED sub-pixels are disposed,
wherein when the columns of second OLED sub-pixels are driven, the transparent display area performs a display function; when the columns of second OLED sub-pixels are not driven, the transparent display area performs a light transmitting function;
a driving mode for the first OLED sub-pixels is active; the first OLED sub-pixels are driven by a part of data signal channels of a display driver integrated chip;
a driving mode for the second OLED sub-pixels is passive; the second OLED sub-pixels are driven by a remaining part of the data signal channels of the display driver integrated chip; and
data from all the data signal channels correspond to one frame of screen display in the display area,
wherein in a direction perpendicular to a plane where the OLED array substrate is located, each of the first OLED sub-pixels includes a lower electrode, a first OLED light emitting structure disposed over the lower electrode, and an upper electrode disposed over the first OLED light emitting structure, and in a direction perpendicular to the plane where the OLED array substrate is located, each of the second OLED sub-pixels comprises: a first electrode extending along a column direction, a second OLED light emitting structure disposed over the first electrode and extending along the column direction, and a second electrode disposed over the second OLED light emitting structure, wherein the second OLED sub-pixels in a section of the transparent display area include sub-pixels of different colors; and a plurality of adjacent second OLED sub-pixels of different colors form one pixel unit, and the first electrodes in the columns of the second OLED sub-pixels of a same color correspond to a same data signal channel or different data signal channels of the display driver integrated chip, wherein each of the data signal channels of the display driver integrated chip is connected to an open drain circuit, and an output of the open drain circuit is connected to the first electrodes of the corresponding second OLED sub-pixels of a same color, and a source electrode of the open drain circuit is connected to a power supply voltage.

2. The OLED array substrate according to claim 1, wherein the lower electrode is a block electrode; and the first electrode is a strip electrode.

3. The OLED array substrate according to claim 1, wherein all the columns of the second OLED sub-pixels in the transparent display area are sub-pixels of a same color, or all columns of the second OLED sub-pixels in a section of the transparent display area are sub-pixels of the same color;

first electrodes in the columns of the second OLED sub-pixels of the same color correspond to a same data signal channel or different data signal channels of the display driver integrated chip.

4. The OLED array substrate according to claim 3, wherein, when the first electrodes in the columns of the second OLED sub-pixels of the same color correspond to a same data signal channel of the display driver integrated chip, an operational amplifier circuit is provided between the first electrode in each column of the second OLED sub-pixels of the same color and a corresponding data signal channel of the display driver integrated chip, the operational amplifier circuit is configured to amplify a data signal of the display driver integrated chip and input the amplified data signal to the first electrode in a corresponding column of the second OLED sub-pixels of the same color;

when the first electrodes in the columns of the second OLED sub-pixels of the same color correspond to different data signal channels of the display driver integrated chip, respectively, an operational amplifier circuit is provided between the first electrode in each column of the second OLED sub-pixels of the same color and a corresponding data signal channel of the display driver integrated chip, the operational amplifier circuit is configured to amplify a data signal of the display driver integrated chip and input the amplified data signal to the first electrode in a corresponding column of the second OLED sub-pixels of the same color.

5. The OLED array substrate according to claim 3, wherein, when the first electrodes in the columns of the second OLED sub-pixels of the same color correspond to a same data signal channel of the display driver integrated chip, each of the data signal channels of the display driver integrated chip is connected to an open drain circuit, an output of the open drain circuit is connected to the first electrodes of the second OLED sub-pixels of a same color, and a source electrode of the open drain circuit is connected to a power supply voltage;

when the first electrodes in the columns of the second OLED sub-pixels of the same color correspond to different data signal channels of the display driver integrated chip, respectively, one data signal channel is connected to an open drain circuit, an output of the open drain circuit is connected to a first electrode of a corresponding second OLED sub-pixel of the same color, and a source electrode of the open drain circuit is connected to a power supply voltage.

6. The OLED array substrate according to claim 1, wherein the second OLED sub-pixels comprise sub-pixels of different colors, and a plurality of adjacent columns of the second OLED sub-pixels of different colors form one pixel unit;

the first electrodes in the columns of the second OLED sub-pixels of a same color correspond to a same data signal channel or different data signal channels of the display driver integrated chip.

7. The OLED array substrate according to claim 6, wherein, when the first electrodes in the columns of the second OLED sub-pixels of the same color correspond to a same data signal channel of the display driver integrated chip, an operational amplifier circuit is provided between the first electrodes in the columns of the second OLED sub-pixels of a same color and a corresponding data signal channel of the display driver integrated chip, the operational amplifier circuit is configured to amplify a data signal of the display driver integrated chip and input the amplified data signal to the first electrodes of the corresponding second OLED sub-pixels of the same color;

when the first electrodes in the columns of the second OLED sub-pixels of the same color correspond to different data signal channels of the display driver integrated chip, respectively, an operational amplifier circuit is provided between the first electrode in each column of the second OLED sub-pixels of the same color and a corresponding data signal channel of the display driver integrated chip, and the operational amplifier circuit is configured to amplify a data signal of the display driver integrated chip and input the amplified data signal to the first electrode in a corresponding column of the second OLED sub-pixels of the same color.

8. The OLED array substrate according to claim 6, wherein, when the first electrodes in the columns of the second OLED sub-pixels of the same color correspond to a same data signal channel of the display driver integrated chip, each of the data signal channels of the display driver integrated chip is connected to an open drain circuit, an output of the open drain circuit is connected to the first electrodes of the corresponding second OLED sub-pixels of a same color, and a source electrode of the open drain circuit is connected to a power supply voltage;

when the first electrodes in the columns of the second OLED sub-pixels of the same color correspond to different data signal channels of the display driver integrated chip, respectively, and one data signal channel is connected to an open drain circuit, an output of the open drain circuit is connected to a first electrode of a corresponding second OLED sub-pixel of the same color, and a source electrode of the open drain circuit is connected to a power supply voltage.

9. The OLED array substrate according to claim 1, wherein, when the first electrodes in the columns of the second OLED sub-pixels of the same color correspond to a same data signal channel of the display driver integrated chip, an operational amplifier circuit is provided between the first electrodes in the columns of the second OLED sub-pixels of a same color and a corresponding data signal channel of the display driver integrated chip, the operational amplifier circuit is configured to amplify a data signal of the display driver integrated chip and input the amplified data signal to the first electrodes of the corresponding second OLED sub-pixels of the same color;

when the first electrodes in the columns of the second OLED sub-pixels of the same color correspond to different data signal channels of the display driver integrated chip, respectively, an operational amplifier circuit is provided between the first electrode in each column of the second OLED sub-pixels of the same color and a corresponding data signal channel of the display driver integrated chip, and the operational amplifier circuit is configured to amplify a data signal of the display driver integrated chip and input the amplified data signal to the first electrode in a corresponding column of the second OLED sub-pixels of the same color.

10. The OLED array substrate according to claim 1, wherein the second electrodes of the second OLED sub-pixels form a planar electrode, and/or the upper electrodes and the first OLED sub-pixels and the second electrodes of the second OLED sub-pixels are connected as a planar electrode.

11. The OLED array substrate according to claim 1, wherein a projection of the first electrode in each column of the second OLED sub-pixels on the plane where the OLED array substrate is located is composed of one or more graphic units; shapes of the graphic units comprising a circle, an ellipse, a dumbbell, an "8" shape, or a rectangle.

12. The OLED array substrate according to claim 1, wherein the first electrodes and the second OLED light emitting structures of the second OLED sub-pixels extend along a column direction in a middle section of the transparent display area, or extend from a top of the transparent display area to a middle or bottom of the transparent display area along the column direction, or extend from the middle of the transparent display area to the bottom of the transparent display area along the column direction.

13. The OLED array substrate according to claim 12, wherein adjacent ones of the second OLED sub-pixels form a pattern, and the pattern comprises a battery-shaped pattern and/or a pattern representing a signal strength.

14. The OLED array substrate according to claim 1, wherein a plurality of the second OLED light emitting structures are separated by pixel definition layers.

15. The OLED array substrate according to claim 1, wherein a ratio of a length of the first electrode in a column direction to a width in a row direction is larger than 20:1.

16. A display panel comprising the OLED array substrate according to claim 1.

17. A display device comprising the display panel according to claim 16.

* * * * *